United States Patent
Yin et al.

(10) Patent No.: US 12,289,956 B2
(45) Date of Patent: Apr. 29, 2025

(54) DISPLAY PANEL INCLUDING A LIGHT EMITTING DEVICE LAYER AND A VIEWING ANGLE ADJUSTMENT FILM AND MANUFACTURING METHOD THEREOF

(71) Applicant: Shenzhen China Star Optoelectronics Semiconductor Display Technology Co., Ltd., Guangdong (CN)

(72) Inventors: Zhiyuan Yin, Guangdong (CN); Lixuan Chen, Guangdong (CN); Xiaosa Gao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 383 days.

(21) Appl. No.: 17/764,553

(22) PCT Filed: Mar. 2, 2022

(86) PCT No.: PCT/CN2022/078761
§ 371 (c)(1),
(2) Date: Mar. 29, 2022

(87) PCT Pub. No.: WO2023/159659
PCT Pub. Date: Aug. 31, 2023

(65) Prior Publication Data
US 2023/0269967 A1 Aug. 24, 2023

(30) Foreign Application Priority Data
Feb. 22, 2022 (CN) .......................... 202210160869.7

(51) Int. Cl.
*H10K 50/86* (2023.01)
*H10K 50/15* (2023.01)
(Continued)

(52) U.S. Cl.
CPC .......... *H10K 50/865* (2023.02); *H10K 50/15* (2023.02); *H10K 50/16* (2023.02); *H10K 50/84* (2023.02);
(Continued)

(58) Field of Classification Search
CPC ...... H10K 50/865; H10K 50/85; H10K 50/86; H10K 50/12; H10K 50/15; H10K 50/854
See application file for complete search history.

(56) References Cited

U.S. PATENT DOCUMENTS

2006/0192471 A1 8/2006 Inoue et al.
2015/0371573 A1* 12/2015 Choi .................. H10K 50/8426
345/206

(Continued)

FOREIGN PATENT DOCUMENTS

CN 109524568 A 3/2019
CN 111276515 A 6/2020
(Continued)

OTHER PUBLICATIONS

International Search Report in International application No. PCT/CN2022/078761, mailed on Nov. 29, 2022.
(Continued)

*Primary Examiner* — Khiem D Nguyen
(74) *Attorney, Agent, or Firm* — Rivka Friedman (57) ABSTRACT

The present application provides a display panel and a manufacturing method thereof. The display panel includes a substrate, a light emitting a device layer, and a viewing angle adjustment film. The light emitting device layer comprises a first viewing angle curve, a film thickness of the light emitting device layer is a film thickness corresponding to a light emission efficiency maximum value point of the first viewing angle curve. The viewing angle adjustment film is configured to adjust the light emission efficiency maximum (Continued)

value point from a side viewing angle to a main viewing angle and obtain a second viewing angle curve to obtain a large viewing angle under a prerequisite without lowering a front viewing angle light emission brightness.

20 Claims, 5 Drawing Sheets

(51) Int. Cl.
  *H10K 50/16* (2023.01)
  *H10K 50/80* (2023.01)
  *H10K 50/84* (2023.01)
  *H10K 50/858* (2023.01)
  *H10K 71/00* (2023.01)

(52) U.S. Cl.
  CPC ......... *H10K 50/858* (2023.02); *H10K 50/868* (2023.02); *H10K 71/00* (2023.02)

(56) References Cited

U.S. PATENT DOCUMENTS

| | | | |
|---|---|---|---|
| 2019/0267443 A1* | 8/2019 | Motoyama | ............ H10K 59/38 |
| 2020/0098834 A1 | 3/2020 | Li et al. | |
| 2020/0168838 A1* | 5/2020 | Hong | ................ G02F 1/133524 |
| 2020/0185652 A1* | 6/2020 | Sun | ...................... H10K 50/844 |
| 2022/0037624 A1* | 2/2022 | Kim | ..................... H10K 50/865 |
| 2023/0006002 A1* | 1/2023 | Wang | .................. H10K 59/353 |

FOREIGN PATENT DOCUMENTS

| | | |
|---|---|---|
| EP | 2648240 A2 | 10/2013 |
| JP | 2013026067 A | 2/2013 |
| WO | 2021254228 A1 | 12/2021 |
| WO | 2022000691 A1 | 1/2022 |

OTHER PUBLICATIONS

Written Opinion of the International Search Authority in International application No. PCT/CN2022/078761, mailed on Nov. 29, 2022.

Chinese Office Action issued in corresponding Chinese Patent Application No. 202210160869.7 dated Sep. 25, 2024, pp. 1-7.

\* cited by examiner

DISPLAY PANEL INCLUDING A LIGHT EMITTING DEVICE LAYER AND A VIEWING ANGLE ADJUSTMENT FILM AND MANUFACTURING METHOD THEREOF

FIELD OF INVENTION

The present application relates to a field of display technologies, especially to a display panel and a manufacturing method thereof.

BACKGROUND OF INVENTION

Improving a size and a resolution of a display panel is one of main development directions of display devices such as organic light emitting diode (OLED) display devices. Because most of OLED devices are top emission structures currently, it results in poor performance of a display device with a large size and a high resolution large viewing angle. Usually, adjusting an optical resonant chamber of an OLED or disposing a viewing angle improvement member on an external of the display panel mitigates an issue of the viewing angle. However, according to the law of conservation of energy, because a number of photons excited from light of a constant color is constant, emitting photons at a different angle for improving a viewing angle inevitably results in energy loss at the viewing angle, which causes reduced viewing angle brightness. Therefore, there is a trade-off between the large viewing angle and the front viewing angle brightness.

SUMMARY OF INVENTION

Technical Issue

An embodiment of the present application provides a display panel and a manufacturing method thereof to solve a technical issue of a lowered front viewing angle brightness due to a conventional display panel improving a large viewing angle.

Technical Solution

To solve the above issue, the present application provides technical solutions as follows:

The present application provides a display panel, including:
  a substrate;
  a light emitting device layer disposed on the substrate, wherein the light emitting device layer includes a first viewing angle curve, the first viewing angle curve includes a light emission efficiency maximum value point, a film thickness of the light emitting device layer is a film thickness corresponding to the light emission efficiency maximum value point, the light emission efficiency maximum value point is at a side viewing angle;
  a viewing angle adjustment film disposed on a side of the light emitting device layer away from the substrate; and
  an anti-reflection layer disposed on a side of the viewing angle adjustment film away from the substrate;
  wherein the viewing angle adjustment film is configured to adjust the light emission efficiency maximum value point from the side viewing angle to a main viewing angle to obtain a second viewing angle curve, and a normal direction of the side viewing angle is inclined to a normal direction of the main viewing angle.

According to the display panel provided by the present application, a tilt angle between a viewing angle corresponding to the light emission efficiency maximum value point on the first viewing angle curve and a normal direction of the main viewing angle ranges from 20 to 40 degrees.

According to the display panel provided by the present application, the viewing angle adjustment film includes:
  a plurality of light adjusting micro structures; and
  a filler layer covering a side of the light adjusting micro structures away from the substrate;
  wherein a refractive index of the filler layer is greater than a refractive index of the light adjusting micro structures.

According to the display panel provided by the present application, each of the light adjusting micro structures is a combination of at least one of a single refraction lens, a double refraction lens, or a multi-refraction lens.

According to the display panel provided by the present application, a material of the light adjusting micro structures is resin.

According to the display panel provided by the present application, the light emitting device layer includes a first electrode, a hole injection layer, a hole transport layer, an organic light emitting layer, an electron transport layer, electron injection layer, and a second electrode sequentially stacked on one another along a direction away from the substrate sequentially layer; and
  wherein a film thickness of the hole injection layer ranges from 20 nm to 30 nm, a film thickness of the hole transport layer ranges from 20 nm to 30 nm, and a film thickness of the organic light emitting layer ranges from 20 nm to 30 nm.

According to the display panel provided by the present application, a film thickness of the first electrode ranges from 10 nm to 15 nm, a film thickness of the electron transport layer ranges from 10 nm to 15 nm, a film thickness of the electron injection layer ranges from 10 nm to 15 nm, and a film thickness of the second electrode ranges from 10 nm to 15 nm.

According to the display panel provided by the present application, the display panel further includes:
  an encapsulation layer covering the side of the light emitting device layer away from the substrate;
  a cover plate disposed on a side of the encapsulation layer away from the substrate; and
  a polarizer disposed on a side of the cover plate away from the substrate; and
  wherein the viewing angle adjustment film is located on a side of the polarizer away from the substrate.

The present application provides a display panel, including:
  a substrate;
  a light emitting device layer disposed on the substrate, wherein the light emitting device layer includes a first viewing angle curve, the first viewing angle curve includes a light emission efficiency maximum value point, a film thickness of the light emitting device layer is a film thickness corresponding to the light emission efficiency maximum value point, the light emission efficiency maximum value point is at a side viewing angle;
  a viewing angle adjustment film disposed on a side of the light emitting device layer away from the substrate; and
  wherein the viewing angle adjustment film is configured to adjust the light emission efficiency maximum value point from the side viewing angle to a main viewing angle to obtain a second viewing angle curve, and a normal direction of the side viewing angle is inclined to a normal direction of the main viewing angle.

According to the display panel provided by the present application, a tilt angle between a viewing angle corresponding to the light emission efficiency maximum value point on the first viewing angle curve and a normal direction of the main viewing angle ranges from 20 to 40 degrees.

According to the display panel provided by the present application, the viewing angle adjustment film includes:
 a plurality of light adjusting micro structures; and
 a filler layer covering a side of the light adjusting micro structures away from the substrate;
 wherein a refractive index of the filler layer is greater than a refractive index of the light adjusting micro structures.

According to the display panel provided by the present application, each of the light adjusting micro structures is a combination of at least one of a single refraction lens, a double refraction lens, or a multi-refraction lens.

According to the display panel provided by the present application, the light emitting device layer includes a first electrode, a hole injection layer, a hole transport layer, an organic light emitting layer, an electron transport layer, electron injection layer, and a second electrode sequentially stacked on one another along a direction away from the substrate sequentially layer; and
 wherein a film thickness of the hole injection layer ranges from 20 nm to 30 nm, a film thickness of the hole transport layer ranges from 20 nm to 30 nm, a film thickness of the organic light emitting layer ranges from 20 nm to 30 nm.

According to the display panel provided by the present application, the display panel further includes:
 an encapsulation layer covering the side of the light emitting device layer away from the substrate;
 a cover plate disposed on a side of the encapsulation layer away from the substrate; and
 a polarizer disposed on a side of the cover plate away from the substrate; and
 wherein the viewing angle adjustment film is located on a side of the polarizer away from the substrate.

According to the display panel provided by the present application, the display panel further includes an anti-reflection layer, and the anti-reflection layer is disposed on a side of the viewing angle adjustment film away from the substrate.

The present application provides a display panel manufacturing method including:
 a step S10: providing substrate;
 a step S20: forming a light emitting device layer on the substrate, wherein the light emitting device layer comprises a first viewing angle curve, the first viewing angle curve includes a light emission efficiency maximum value point, and adjusting a film thickness of the light emitting device layer to make the light emission efficiency maximum value point position located at a side viewing angle; and
 a step S30: forming a viewing angle adjustment film on a side of the light emitting device layer away from the substrate, wherein the viewing angle adjustment film is configured to adjust the light emission efficiency maximum value point from the side viewing angle to a main viewing angle to obtain a second viewing angle curve.

According to the manufacturing method provided by the present application, the step S20 includes:
 a step S201: importing each of parameters of the light emitting device layer into a physical optics simulation software to obtain the first viewing angle curve; and
 a step S202: adjusting a film thickness parameter of the light emitting device layer to make the light emission efficiency maximum value point on the first viewing angle curve at a side viewing angle.

According to the manufacturing method provided by the present application, the step S30 includes:
 a step S301: forming an encapsulation layer on the side of the light emitting device layer away from the substrate;
 a step S302: attaching a cover plate and a polarizer sequentially on a side of the encapsulation layer away from the substrate; and
 a step S303: providing a viewing angle adjustment film, attaching the viewing angle adjustment film to a side of the polarizer away from the substrate.

According to the manufacturing method provided by the present application, the viewing angle adjustment film includes manufacturing steps as follows:
 providing an underlay;
 forming the light adjusting micro structures on a side of the underlay;
 forming a filler layer on a side of the light adjusting micro structures away from the underlay; and
 peeling the underlay off.

According to the manufacturing method provided by the present application, the step S30 comprises importing the first viewing angle curve into a geometrical optics simulation software, and adjusting parameters of the light adjusting micro structures and the filler layer such that the light emission efficiency maximum value point is adjusted from the side viewing angle to a main viewing angle to obtain the second viewing angle curve.

Advantages

Advantages of the present application are as follows: the present application provides a display panel and a manufacturing method thereof. A light emitting device layer of the display panel includes a first viewing angle curve, the first viewing angle curve includes a light emission efficiency maximum value point. By adjusting a film thickness of the light emitting device layer as a film thickness corresponding to the light emission efficiency maximum value, within an allowable light color range, a light emission efficiency of the light emitting device layer can be adjusted to a maximum to make a light emission efficiency maximum value point located at a side viewing angle. Furthermore, a viewing angle adjustment film is disposed on a side of light emitting device layer away from the substrate, the viewing angle adjustment film adjusts the light emission efficiency maximum value point from a side viewing angle to a main viewing angle and obtains a second viewing angle curve. Compared to a conventional way of achieving a large viewing angle by sacrificing a front viewing angle light emission brightness, the present application can obtain a large viewing angle under a perquisite without lowering the front viewing angle light emission brightness, which achieves both excellent light emission brightness and viewing angle under light of a constant color.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Reference numeral indication:
1, substrate; 2, light emitting device layer; 21, first electrode; 22, hole injection layer; 23, hole transport layer; 24, organic light emitting layer; 25, electron transport layer; 26, electron injection layer; 27, second electrode; 3, encapsulation layer; 4, cover plate; 5, polarizer; 6, viewing angle adjustment film; 61, light adjusting micro structures; 62, filler layer; 7, pixel definition layer.

DETAILED DESCRIPTION OF PREFERRED EMBODIMENTS

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

Figure 1:
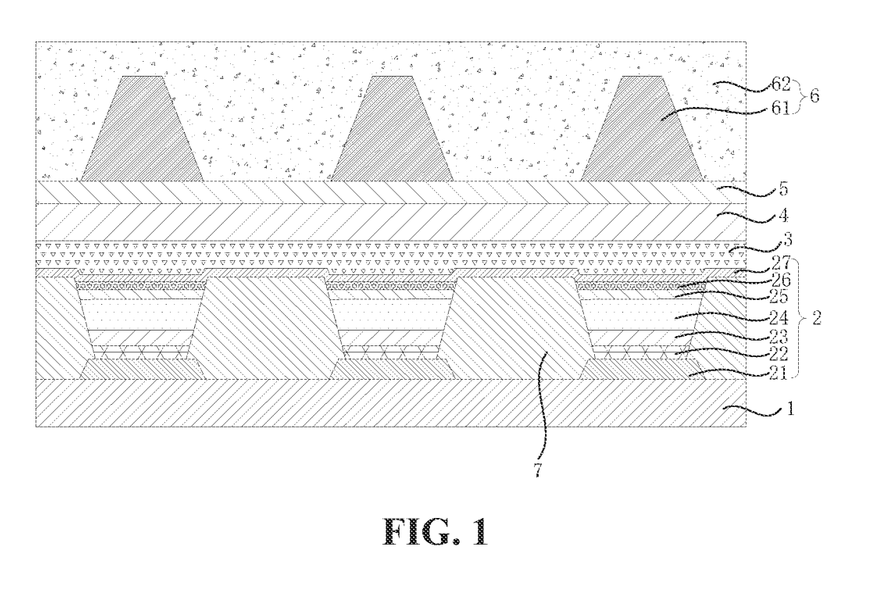
FIG. 1 is a schematic cross-sectional structural view of a display panel provided by an embodiment of the present application.
Figure 2:
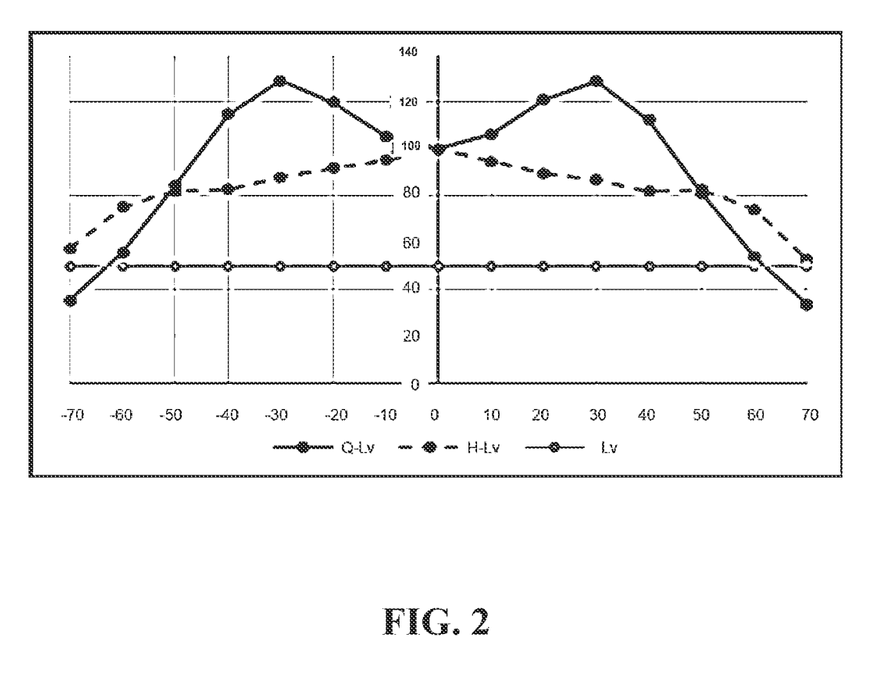
FIG. 2 is a comparison chart of a first viewing angle curve and a second viewing angle curve of the display panel provided by the embodiment of the present application.

With reference to FIGS. 1 and 2, FIG. 1 is a schematic cross-sectional structural view of a display panel provided by an embodiment of the present application; FIG. 2 is a comparison chart of a first viewing angle curve and a second viewing angle curve of the display panel provided by the embodiment of the present application; the display panel of the embodiment of the present application provides includes a substrate 1, a light emitting device layer 2 and a viewing angle adjustment film 6.

The light emitting device layer 2 is disposed on the substrate 1. The light emitting device layer 2 includes a first viewing angle curve. The first viewing angle curve includes light emission efficiency maximum value point. A film thickness of the light emitting device layer 2 is a film thickness corresponding to the light emission efficiency maximum value point. The light emission efficiency maximum value point is at a side viewing angle. The viewing angle adjustment film 6 is disposed on a side of the light emitting device layer 2 away from the substrate 1. The viewing angle adjustment film 6 adjusts the light emission efficiency maximum value point from the side viewing angle to a main viewing angle and obtains a second viewing angle curve. A normal direction of the side viewing angle is inclined to a normal direction of the main viewing angle.

It can be understood that the display panel provided by the embodiment of the present application, by adjusting a film thickness of the light emitting device layer 2 as a film thickness corresponding to the light emission efficiency maximum value, can adjust a light emission efficiency of the light emitting device layer 2 to a maximum within an allowable light color range to make the light emission efficiency maximum value point at a side viewing angle; Furthermore, a viewing angle adjustment film 6 is disposed on a side of the light emitting device layer 2 away from the substrate 1, the viewing angle adjustment film 6 adjusts the light emission efficiency maximum value point from the side viewing angle to the main viewing angle and obtains a second viewing angle curve. Compared to a conventional way achieving a large viewing angle by sacrificing a front viewing angle light emission brightness, the present application can obtain the large viewing angle under a prerequisite without lowering the front viewing angle light emission brightness, which achieves both excellent light emission brightness and viewing angle under light of a constant color.

In particular, the light emitting device layer 2 includes a first electrode 21, a hole injection layer 22, a hole transport layer 23, an organic light emitting layer 24, an electron transport layer 25, an electron injection layer 26, and a second electrode 27 sequentially stacked on one another along a direction of away from the substrate 1. The display panel further includes a pixel definition layer 7. In a region defining the pixel definition layer 7, a plurality of pixel aperture. The first electrode 21 is disposed on the substrate 1 on a boundary of. The pixel definition layer 7 covers the substrate 1 and a part of the first electrode 21. The pixel aperture partially expose a surface of a side of the anode away from the substrate 1. The hole injection layer 22, the hole transport layer 23, the organic light emitting layer 24, the electron transport layer 25, and the electron injection layer 26 are stacked and disposed on a side of the anode away from the substrate 1 and are located in the pixel aperture. The second electrode 27 covers the pixel electrode layer and a side of the electron injection layer 26 away from the substrate 1.

It should be explained that in the light emitting device layer 2, the first electrode 21 is an anode, and the anode is a reflective electrode. The second electrode 27 is a cathode, and the cathode is a semi-transparent and semi-reflective electrode or fully transparent electrode. The light emitting device layer 2 forms a resonant chamber because of existence of the first electrode 21 and the second electrode 27. The cathode being a transparent electrode is taken as an example, light emitted from the organic light emitting layer 24 partially directly passes through the first electrode 21 and is emitted out to an ambient environment such that another remaining part of light emitted out from the organic light emitting layer 24 sequentially passes through the hole transport layer 23 and the hole injection layer 22, then is emitted on the first electrode 21, is reflected by the first electrode 21, then sequentially passes through the hole injection layer 22, the hole transport layer 23, the organic light emitting layer 24, and the second electrode 27, and is emitted to an ambient environment. Therefore, a distance between the first electrode 21 and the second electrode 27 can be adjusted to make a phase difference between two parts of light fulfill an interference condition to increase intensity of the light mutually such that a light emission efficiency of the light emitting device layer 2 is increased to adjust the light emission efficiency of the light emitting device layer 2 to the light emission efficiency maximum value.

Namely, a thickness of one or more film layers of the first electrode 21, the hole injection layer 22, the hole transport layer 23, the organic light emitting layer 24, the electron transport layer 25, the electron injection layer 26, and the second electrode 27 can be adjusted. Because the film thickness of each film layer in the light emitting device layer 2 is adjusted as a film thickness equal to the film thickness of the light emission efficiency maximum value, a light emission efficiency of the light emitting device layer 2 can be increased. The embodiment of the present application has no limit to adjustment of a film thickness of any specific layer as long as the film thickness of the light emitting device layer 2 is adjusted to make a light emission efficiency of the light emitting device layer 2 achieving the light emission efficiency maximum value.

Furthermore, for an aspect of an optical angle, the hole injection layer 22, the hole transport layer 23, and the organic light emitting layer 24 are more obviously effective to resonant chamber and absorb less light. Therefore, the embodiment of the present application can adjust a light emission efficiency of the light emitting device layer 2 to the light emission efficiency maximum value by adjusting the film thicknesses of the hole injection layer 22, the hole transport layer 2, and the organic light emitting layer 24.

Furthermore, because the first electrode 21 and the second electrode 27 are usually formed by an evaporation or sputtering process, and the hole injection layer 22, the hole transport layer 23 and the organic light emitting layer 24 are usually formed by a jet-ink printing process, the jet-ink printing process, compared to evaporation or sputtering process, only requires few droplets of ink to adjust a film thickness, which makes adjustment of a film thickness of each film layer easier. Therefore, the embodiment of the present application, by adjusting the film thicknesses of the hole injection layer 22, the hole transport layer 23, and the organic light emitting layer 24, can easily and precisely fine adjust the film thickness of the light emitting device layer 2 to further improve optical characteristics.

In particular, a film thickness of the hole injection layer 22 ranges from 20 nm to 30 nm, a film thickness of the hole transport layer 23 ranges from 20 nm to 30 nm, and a film thickness of the organic light emitting layer 24 ranges from 20 nm to 30 nm.

In particular, a film thickness of the first electrode 21 ranges from 10 nm to 15 nm, a film thickness of the electron transport layer 25 ranges from 10 nm to 15 nm, a film thickness of the electron injection layer 26 ranges from 10 nm to 15 nm, and a film thickness of the second electrode 27 ranges from 10 nm to 15 nm.

It should be explained that "a film thickness of the light emitting device layer 2 is a film thickness corresponding to the light emission efficiency maximum value point" in the embodiment of the present application refers to a film thickness within a range from 10% less than a film thickness to 10% more than the film thickness corresponding to the light emission efficiency maximum value point.

In the embodiment of the present application, a tilt angle between a viewing angle corresponding to the light emission efficiency maximum value point on the first viewing angle curve and a normal direction of the main viewing angle ranges from 20 to 40 degrees. It should be explained that the tilt angle is excessive small, because the light emission efficiency maximum value is near the main viewing angle, adjusting the viewing angle of the light emission efficiency maximum value by the viewing angle adjustment film 6 is meaningless and is unable to achieve the above advantages. The greater the tilt angle is, the harder the viewing angle adjustment film 6 adjusts the light emission efficiency maximum value point of a large angle to the main viewing angle. Therefore, an over large or small tilt angle should be avoided.

It should be explained that it can be understood that the first viewing angle curve is a relationship curve between viewing angle and brightness of light emitted out from the light emitting device layer 2 without the viewing angle adjustment film 6. The second viewing angle curve is a relationship curve between viewing angle and brightness of light emitted out from the light emitting device layer 2 with the viewing angle adjustment film. The front viewing angle is 0 degree, and the side viewing angle is from 0 to 90 degrees.

The viewing angle adjustment film 6 includes a plurality of light adjusting micro structures 61 and a filler layer 62. The light adjusting micro structures 61 are disposed to correspond to a plurality of the light emission pixels such that light emitted out from the light emitting device layer 2 can pass through the light adjusting micro structures 61. The filler layer 62 covers a side of the light adjusting micro structures 61 away from the substrate 1. A refractive index of the filler layer 62 is greater than a refractive index of the light adjusting micro structures 61 such that light emitted out from the light emitting device layer 2 is refracted on a boundary between the light adjusting micro structures 61 and the filler layer 62, in one aspect, to adjust the light emission efficiency maximum value point from the side viewing angle to the main viewing angle to obtain a second viewing angle curve, and in another aspect, to diffuse light toward the side viewing angle, which advantages improvement of the viewing angle of the display panel to obtain a large viewing angle.

In particular, a material of the light adjusting micro structures 61 is resin. A material of the filler layer 62 is resin. The embodiment of the present application controls a relationship between refractive indexes of the light adjusting micro structures 61 and the filler layer 62 such that light is refracted on a boundary between the light adjusting micro structures 61 and the filler layer 62. In particular, the refractive index of the light adjusting micro structures 61 ranges from 1.2 to 1.4, for example, 1.2, 1.25, 1.3, 1.35, 1.4. The refractive index of the filler layer 62 ranges from 1.6 to 1.7, for example, 1.6, 1.65, 1.7.

Figure 3A:
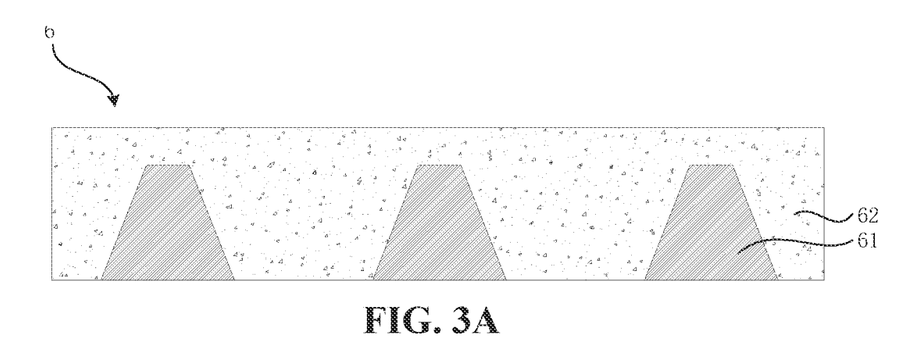
FIG. 3A is a first schematic cross-sectional structural view of light adjusting micro structures of the display panel provided by the embodiment of the present application.
Figure 3B:
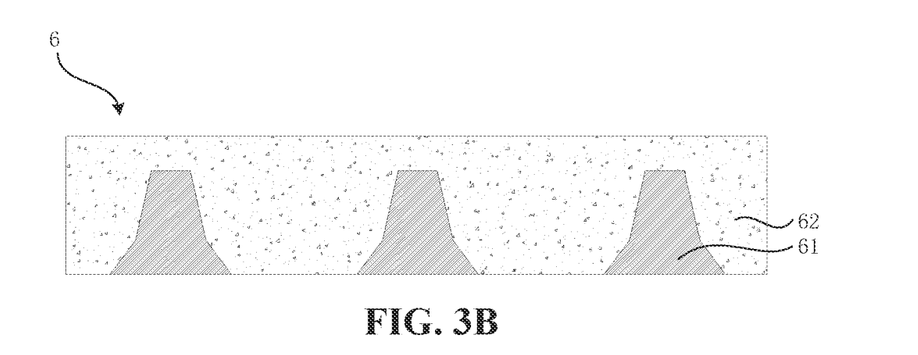
FIG. 3B is a second schematic cross-sectional structural view of light adjusting micro structures of the display panel provided by the embodiment of the present application.
Figure 3C:
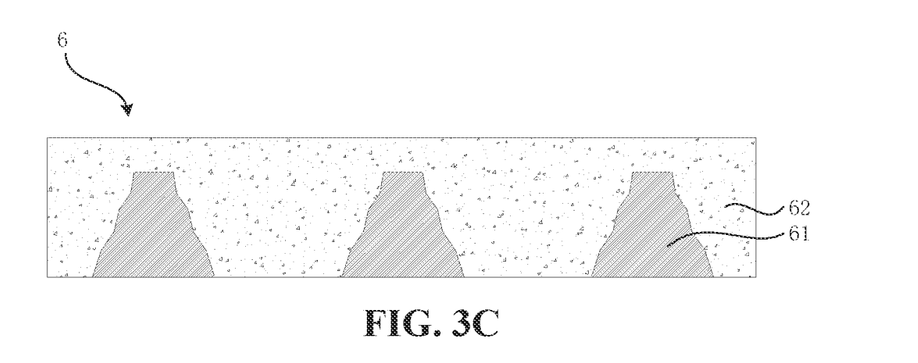
FIG. 3C is a third schematic cross-sectional structural view of light adjusting micro structures of the display panel provided by the embodiment of the present application.

In particular, the light adjusting micro structures 61 are trapezoidal prism micro structures. The light adjusting micro structures 61 are a combination of at least one of a single refraction lens, a double refraction lens, or a multi-refraction lens, for example, with reference to FIGS. 1 and 3A, FIG. 3A is a first schematic cross-sectional structural view of light adjusting micro structures of the display panel provided by the embodiment of the present application, the light adjusting micro structures 61 are single refraction lenses. For another example, with reference to FIG. 3B, FIG. 3B is a second schematic cross-sectional structural view of light adjusting micro structures of the display panel provided by the embodiment of the present application, the light adjusting micro structures 61 are double refraction lenses. Furthermore, with reference to FIG. 3C, FIG. 3C is a third schematic cross-sectional structural view of light adjusting micro structures of the display panel provided by the embodiment of the present application, the light adjusting micro structures 61 are multi-refraction lenses. Furthermore, the light adjusting micro structures 61 can be in form of one-dimension, the light adjusting micro structures 61 can be strip-like. The light adjusting micro structures 61 can also be in form of a two-dimensional array. In the meantime, the light adjusting micro structures 61 are disposed to correspond to a plurality of light emission pixels of the light emitting device layer 2. It should be explained that the embodiment of the present application has no limit to a specific structure form of the light adjusting micro structures 61. To reach better improvement of the viewing angle of the light adjusting micro structures 61, the structure of the light adjusting micro structures 61 needs to be more complicated.

It should be explained that for first viewing angle curves of different types of the light emitting device layer 2, from the front viewing angle to the side viewing angle, the light adjusting micro structures 61 with different parameters should be designed according to a decay degree of brightness of the light emitting device layer 2 to achieve an objective of adjusting the light emission efficiency maximum value point from the side viewing angle to the main viewing angle.

In an embodiment, the display panel further includes an encapsulation layer 3, cover plate 4 and a polarizer 5. The encapsulation layer 3 covers a side of the light emitting device layer 2 away from the substrate 1. The encapsulation layer 3 employs a thin film encapsulation to prevent external water oxygen from invading the light emitting device layer 2. the cover plate 4 is disposed on a side of the encapsulation layer 3 away from the substrate 1, in the embodiment of the present application, the cover plate 4 is a rigid cover plate 4. Optionally, the cover plate 4 is a transparent glass cover plate 4. The polarizer 5 is disposed on a side of the cover plate 4 away from the substrate 1. The viewing angle adjustment film 6 is located on a side of the polarizer 5 away from the substrate 1.

It should be explained that in other embodiment, the viewing angle adjustment film 6 can also be disposed on a side of the cover plate 4 near the substrate 1. However, under such circumstance, a refractive index of the cover plate 4 is usually less than 1.5, in other words, the refractive index of the cover plate 4 is less than a refractive index of the viewing angle adjustment film 6, light is easily refracted on a boundary between the viewing angle adjustment film 6 and the cover plate 4 to influence the light emission efficiency, which disadvantages an improvement effect of the viewing angle. Therefore, the embodiment of the present application disposes the viewing angle adjustment film 6 on a side of the cover plate 4 away from the substrate 1, which can prevent the cover plate 4 from influencing the light emission efficiency.

Furthermore, the display panel further includes anti-reflection layer, the anti-reflection layer is disposed on a side of the viewing angle adjustment film away from the substrate 1 and is configured to redduce light reflection, which advantages light emission efficiency.

With further reference to FIG. 2 and Table 1, the applicant experiments on and verifies technical solutions of the present application. In FIG. 2, a solid curve Q-LV refers to a first viewing angle curve, a dotted curve H-LV refers to a second viewing angle curve, a solid straight line LV is a standard line of a 50% single side viewing angle, wherein the 50% single side viewing angle refers to 50% of front viewing angle brightness of the single side viewing angle. For an example of the light adjusting micro structures 61 being a double refraction lens is taken as, in the first viewing angle curve, the light emission efficiency maximum value point is located at 30 degrees, The light emission efficiency maximum value is 130%, when the brightness reaches 50% of the front viewing angle brightness, namely the brightness reaching 1000 nits, the viewing angle is 60 degrees. In the second viewing angle curve, the light emission efficiency maximum value point is located at 0 degrees (front viewing angle), the light emission efficiency maximum value is 100%, when the brightness reaches 50% of the front viewing angle brightness, namely the brightness reaching 1000 nits, the viewing angle is greater than 70 degrees. As such, when brightness of the first viewing angle curve and the second viewing angle curve reaches 50% of the front viewing angle brightness a phase difference between the viewing angles corresponding to the first viewing angle curve and the second viewing angle curve is greater than 10 degrees. It can be understood that in the embodiment of the present application, for the same brightness, a viewing angle after the viewing angle adjustment film is disposed is greater than a viewing angle before the viewing angle adjustment film is disposed. For the same viewing angle, brightness after the viewing angle adjustment film is disposed is greater than brightness before the viewing angle adjustment film is disposed. Therefore, the display panel provided by the embodiment of the present application can obtain a greater viewing angle and increase brightness of the side viewing angle.

TABLE 1

|  | Brightness/ nits | 50% Single side viewing angle |
|---|---|---|
| Before film attachment | 1000 | 60 |
| After film attachment | 1000 | 70 |

Furthermore, the front viewing angle brightness in the second viewing angle curve is equal to the front viewing angle brightness of the first viewing angle curve, and both reach 100%. The front viewing angle brightness in the second viewing angle curve, compared to the front viewing angle brightness in the first viewing angle curve, is not apparently lowered. Therefore, the embodiment of the present application can obtain a large viewing angle under a prerequisite without lowering the front viewing angle brightness, and is apparently inventive compared to a conventional technology sacrificing the front viewing angle brightness to obtain a large viewing angle. Also, the second viewing angle curve, compared to the first viewing angle curve, has a slower decline of brightness from the front viewing angle to the side viewing angle, which advantages improvement of uniformity of brightness at different viewing angles of the display panel to improve a display effect.

Figure 4:
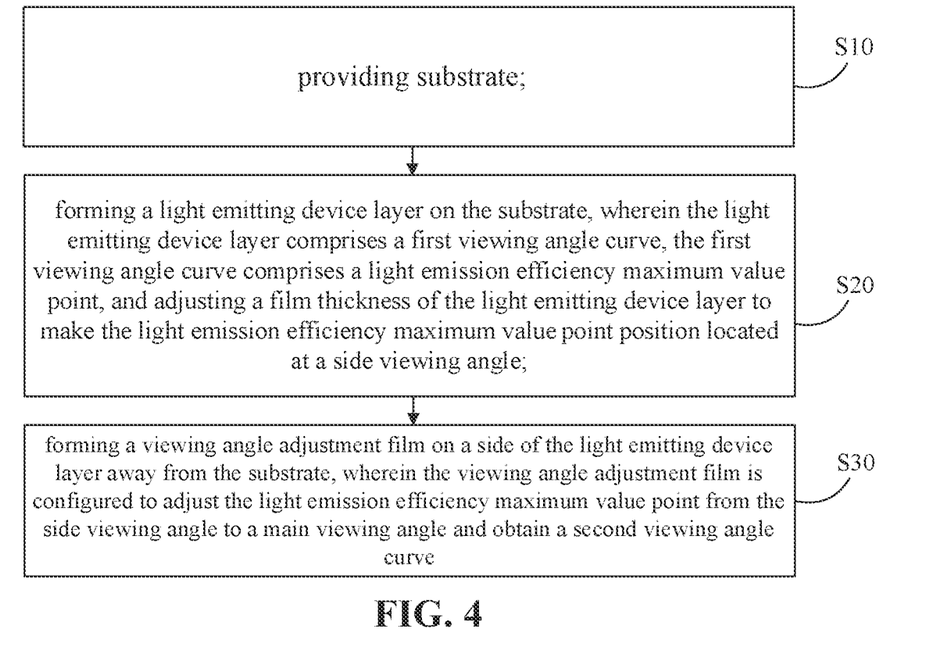
FIG. 4 is a flowchart of a display panel manufacturing method provided by the embodiment of the present application.

With reference to FIGS. 4 and 5A to 5D, the embodiment of the present application further provides a display panel manufacturing method, includes steps as follows:

A step S10 includes providing a substrate 1.

Figure 5A:
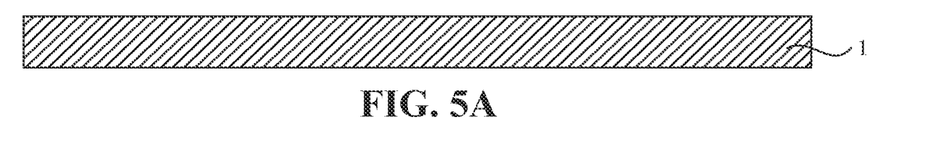
FIGS. 5A to 5D are schematic structural views of processes of the display panel manufacturing method provided by the embodiment of the present application provides.

In particular, With reference to FIG. 5A, the substrate 1 is an array substrate. The substrate 1 includes a pixel driving circuits layer, the pixel driving circuits layer includes a plurality of pixel driving circuits, a plurality of the pixel driving circuits is configured to drive a corresponding one or more of the light emission pixels to emit light.

A step S20 includes forming a light emitting device layer 2 on the substrate 1, wherein the light emitting device layer 2 includes a first viewing angle curve, the first viewing angle curve includes a light emission efficiency maximum value point, adjusting a film thickness of the light emitting device layer 2 to make the light emission efficiency maximum value point located at a side viewing angle.

Figure 5B:
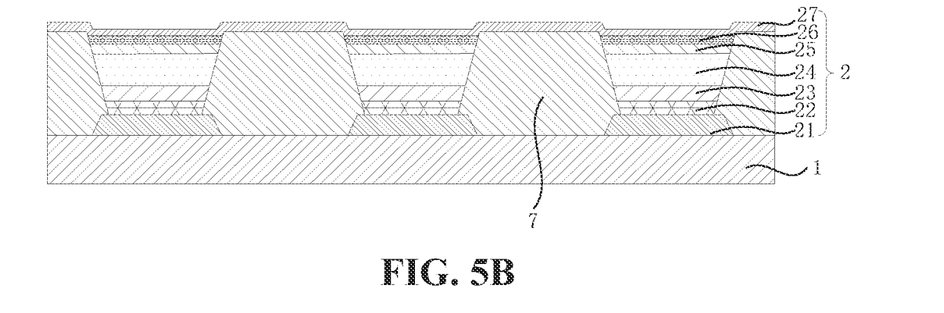

In particular, with reference to FIG. 5B, the step S20 includes steps as follows:

A step S201 includes importing each of parameters of the light emitting device layer 2 into a physical optics simulation software to obtain the first viewing angle curve.

A step S202 includes adjusting a film thickness parameter of the light emitting device layer 2 to make the light emission efficiency maximum value point on the first viewing angle curve located at a side viewing angle.

In the embodiment of the present application, the light emitting device layer 2 includes a hole injection layer 22, a hole transport layer 23, and an organic light emitting layer 24 sequentially stacked on one another. A film thickness of the hole injection layer 22 ranges from 20 nm to 30 nm, a film thickness of the hole transport layer 23 ranges from 20 nm to 30 nm, and a film thickness of the organic light emitting layer 24 ranges from 20 nm to 30 nm.

Optionally, in the embodiment of the present application, the physical optics simulation software in the step S201 can be a time domain finite differential simulation software.

A step S30 includes forming a viewing angle adjustment film 6 on a side of the light emitting device layer 2 away from the substrate 1 forming a viewing angle adjustment film 6, wherein the viewing angle adjustment film 6 is configured to adjust the light emission efficiency maximum value point from the side viewing angle to the main viewing angle to obtain a second viewing angle curve.

Figure 5C:
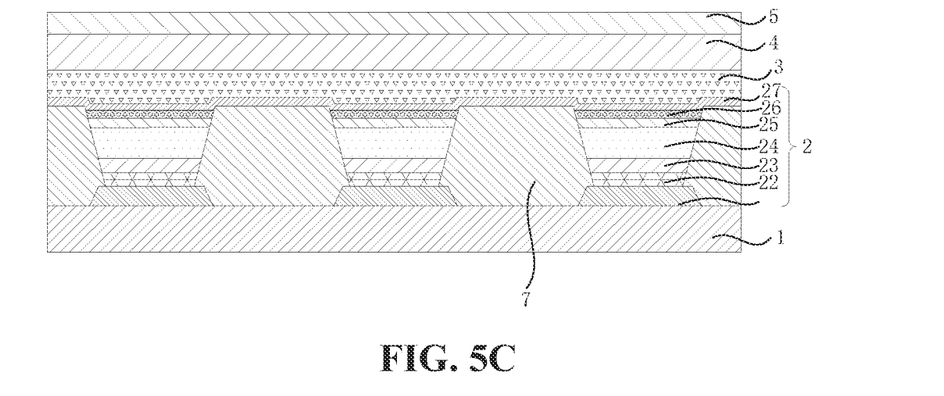
Figure 5D:
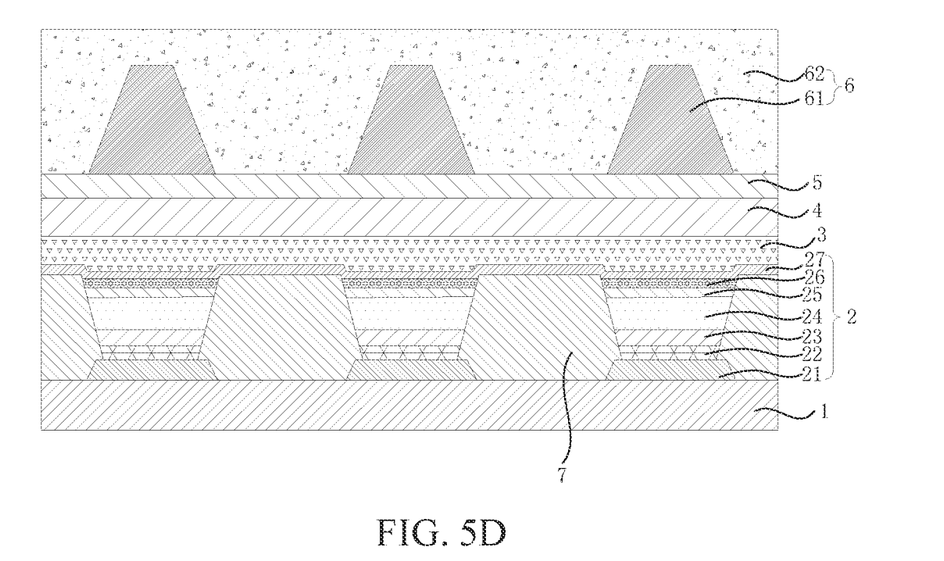

In particular, with reference to FIGS. 5C and 5D, when the viewing angle adjustment film 6 is located on a side of the polarizer 5 away from the substrate 1, the step S30 includes:

a step S301: forming an encapsulation layer 3 on a side of the light emitting device layer 2 away from the substrate 1;

a step S302: attaching a cover plate 4 and a polarizer 5 sequentially on a side of the encapsulation layer 3 away from the substrate 1; and a step S303: providing a viewing angle adjustment film 6, attaching the viewing angle adjustment film 6 on a side of the polarizer 5 away from the substrate 1.

a step S301: forming a plurality of light adjusting micro structures 61 on a side of the light emitting device layer 2 away from the substrate 1, wherein the light adjusting micro structures 61 is disposed to correspond to a plurality of light emission pixels of the light emitting device layer 2;

a step S302: forming a filler layer 62 covering a side of the light adjusting micro structures 61 away from the substrate 1.

In particular, the viewing angle adjustment film 6, after formed integrally, is attached to a side of the polarizer 5 away from the substrate 1. Manufacturing steps of the viewing angle adjustment film 6 include:

providing an underlay;

forming the light adjusting micro structures 61 on the underlay;

forming a filler layer 62 on a side of the light adjusting micro structures 61 away from the underlay; and peeling the underlay of.

In other embodiment, when the viewing angle adjustment film 6 can also be disposed on a side of the cover plate 4 near the substrate 1. After formation of the encapsulation layer 3, the viewing angle adjustment film 6 can be manufactured directly on the encapsulation layer 3. In particular, under such circumstance, the step S30 includes:

a step S301: forming an encapsulation layer 3 on a side of the light emitting device layer 2 away from the substrate 1;

a step S302: forming a plurality of light adjusting micro structures 61 on a side of the encapsulation layer 3 away from the substrate 1; and a step S303: forming a filler layer 62 covering a side of the light adjusting micro structures 61 away from the substrate 1; and a step S304: sequentially attaching the cover plate 4 and the polarizer 5 to a side of the filler layer 62 away from the substrate 1. In particular, a refractive index of the filler layer 62 is greater than a refractive index of the light adjusting micro structures 61. The refractive index of the light adjusting micro structures 61 ranges from 1.2 to 1.4, for example, 1.2, 1.25, 1.3, 1.35, 1.4. The refractive index of the filler layer 62 ranges from 1.6 to 1.7, for example, 1.6, 1.65, 1.7.

Optionally, a material of the light adjusting micro structures 61 is resin. A material of the filler layer 62 is resin.

Furthermore, in the step S30, the first viewing angle curve is imported into a geometrical optics simulation software, parameters of the light adjusting micro structures 61 and the filler layer 62 are adjusted such that the light emission efficiency maximum value point is adjusted from the side viewing angle to the main viewing angle to obtain the second viewing angle curve.

Optionally, in the embodiment of the present application, the geometrical optics simulation software in the step S301 can be a Demax simulation software.

Advantages: The display panel and the manufacturing method thereof provided by the present application, a light emitting device layer of the display panel includes a first viewing angle curve, and the first viewing angle curve includes light emission efficiency maximum value point. By adjusting a film thickness of the light emitting device layer as a film thickness corresponding to the light emission efficiency maximum value, within an allowable light color range, a light emission efficiency of the light emitting device layer can be adjusted to a maximum to make a light emission efficiency maximum value point located at a side viewing angle. Furthermore, a viewing angle adjustment film is disposed on a side of light emitting device layer away from the substrate, the viewing angle adjustment film adjusts the light emission efficiency maximum value point from a side viewing angle to a main viewing angle and obtains a second viewing angle curve. Compared to a conventional way of achieving a large viewing angle by sacrificing a front viewing angle light emission brightness, the present application can obtain a large viewing angle under a perquisite without lowering the front viewing angle light emission brightness, which achieves both excellent light emission brightness and viewing angle under light of a constant color.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims. The present application aims at the prior art, the present embodiment can solve the defects.

What is claimed is:

1. A display panel, comprising:
    a substrate;
    a light emitting device layer disposed on the substrate, wherein the light emitting device layer comprises a first viewing angle curve, the first viewing angle curve comprises a light emission efficiency maximum value point, a film thickness of the light emitting device layer is a film thickness corresponding to the light emission efficiency maximum value point, the light emission efficiency maximum value point is at a side viewing angle;
    a viewing angle adjustment film disposed on a side of the light emitting device layer away from the substrate; and
    an anti-reflection layer disposed on a side of the viewing angle adjustment film away from the substrate;
    wherein the viewing angle adjustment film is configured to adjust the light emission efficiency maximum value point from the side viewing angle to a main viewing angle to obtain a second viewing angle curve, and a normal direction of the side viewing angle is inclined to a normal direction of the main viewing angle.

2. The display panel according to claim 1, wherein a tilt angle between a viewing angle corresponding to the light emission efficiency maximum value point on the first viewing angle curve and a normal direction of the main viewing angle ranges from 20 to 40 degrees.

3. The display panel according to claim 1, wherein the viewing angle adjustment film comprises:
    a plurality of light adjusting micro structures; and
    a filler layer covering a side of the light adjusting micro structures away from the substrate;
    wherein a refractive index of the filler layer is greater than a refractive index of the light adjusting micro structures.

4. The display panel according to claim 3, wherein each of the light adjusting micro structures is one or a combination selected from a single refraction lens, a double refraction lens, and a multi-refraction lens.

5. The display panel according to claim 4, wherein a material of the light adjusting micro structures is resin.

6. The display panel according to claim 1, wherein the light emitting device layer comprises a first electrode, a hole injection layer, a hole transport layer, an organic light emitting layer, an electron transport layer, an electron injection layer, and a second electrode sequentially stacked on one another along a direction away from the substrate sequentially layer; and
    wherein a film thickness of the hole injection layer ranges from 20 nm to 30 nm, a film thickness of the hole transport layer ranges from 20 nm to 30 nm, and a film thickness of the organic light emitting layer ranges from 20 nm to 30 nm.

7. The display panel according to claim 6, wherein a film thickness of the first electrode ranges from 10 nm to 15 nm, a film thickness of the electron transport layer ranges from 10 nm to 15 nm, a film thickness of the electron injection layer ranges from 10 nm to 15 nm, and a film thickness of the second electrode ranges from 10 nm to 15 nm.

8. The display panel according to claim 1, wherein the display panel further comprises:
    an encapsulation layer covering the side of the light emitting device layer away from the substrate;
    a cover plate disposed on a side of the encapsulation layer away from the substrate; and
    a polarizer disposed on a side of the cover plate away from the substrate; and
    wherein the viewing angle adjustment film is located on a side of the polarizer away from the substrate.

9. A display panel, comprising:
    a substrate;
    a light emitting device layer disposed on the substrate, wherein the light emitting device layer comprises a first viewing angle curve, the first viewing angle curve comprises a light emission efficiency maximum value point, a film thickness of the light emitting device layer is a film thickness corresponding to the light emission efficiency maximum value point, the light emission efficiency maximum value point is at a side viewing angle;
    a viewing angle adjustment film disposed on a side of the light emitting device layer away from the substrate; and
    wherein the viewing angle adjustment film is configured to adjust the light emission efficiency maximum value point from the side viewing angle to a main viewing angle to obtain a second viewing angle curve, and a normal direction of the side viewing angle is inclined to a normal direction of the main viewing angle.

10. The display panel according to claim 9, wherein a tilt angle between a viewing angle corresponding to the light emission efficiency maximum value point on the first viewing angle curve and a normal direction of the main viewing angle ranges from 20 to 40 degrees.

11. The display panel according to claim 9, wherein the viewing angle adjustment film comprises:
    a plurality of light adjusting micro structures; and
    a filler layer covering a side of the light adjusting micro structures away from the substrate;
    wherein a refractive index of the filler layer is greater than a refractive index of the light adjusting micro structures.

12. The display panel according to claim 11, wherein each of the light adjusting micro structures is a combination of at least one of a single refraction lens, a double refraction lens, or a multi-refraction lens.

13. The display panel according to claim 9, wherein the light emitting device layer comprises a first electrode, a hole injection layer, a hole transport layer, an organic light emitting layer, an electron transport layer, an electron injection layer, and a second electrode sequentially stacked on one another along a direction away from the substrate sequentially layer; and
    wherein a film thickness of the hole injection layer ranges from 20 nm to 30 nm, a film thickness of the hole transport layer ranges from 20 nm to 30 nm, and a film thickness of the organic light emitting layer ranges from 20 nm to 30 nm.

14. The display panel according to claim 9, wherein the display panel further comprises:
   an encapsulation layer covering the side of the light emitting device layer away from the substrate;
   a cover plate disposed on a side of the encapsulation layer away from the substrate; and
   a polarizer disposed on a side of the cover plate away from the substrate; and
   wherein the viewing angle adjustment film is located on a side of the polarizer away from the substrate.

15. The display panel according to claim 14, wherein the display panel further comprises an anti-reflection layer, and the anti-reflection layer is disposed on a side of the viewing angle adjustment film away from the substrate.

16. A display panel manufacturing method, comprising:
   a step S10: providing substrate;
   a step S20: forming a light emitting device layer on the substrate, wherein the light emitting device layer comprises a first viewing angle curve, the first viewing angle curve comprises a light emission efficiency maximum value point, and adjusting a film thickness of the light emitting device layer to make the light emission efficiency maximum value point position located at a side viewing angle; and
   a step S30: forming a viewing angle adjustment film on a side of the light emitting device layer away from the substrate, wherein the viewing angle adjustment film is configured to adjust the light emission efficiency maximum value point from the side viewing angle to a main viewing angle and obtain a second viewing angle curve.

17. The manufacturing method according to claim 16, wherein the step S20 comprises:
   a step S201: importing each of parameters of the light emitting device layer into a physical optics simulation software to obtain the first viewing angle curve; and
   a step S202: adjusting a film thickness parameter of the light emitting device layer to make the light emission efficiency maximum value point on the first viewing angle curve at a side viewing angle.

18. The manufacturing method according to claim 17, wherein the step S30 comprises:
   a step S301: forming an encapsulation layer on the side of the light emitting device layer away from the substrate;
   a step S302: attaching a cover plate and a polarizer sequentially on a side of the encapsulation layer away from the substrate; and
   a step S303: providing a viewing angle adjustment film, attaching the viewing angle adjustment film to a side of the polarizer away from the substrate.

19. The manufacturing method according to claim 18, wherein the viewing angle adjustment film comprises manufacturing steps as follows:
   providing an underlay;
   forming a plurality of light adjusting micro structures on a side of the underlay;
   forming a filler layer on a side of the light adjusting micro structures away from the underlay; and
   peeling the underlay off.

20. The manufacturing method according to claim 19, wherein the step S30 comprises importing the first viewing angle curve into a geometrical optics simulation software, and adjusting parameters of the light adjusting micro structures and the filler layer such that the light emission efficiency maximum value point is adjusted from the side viewing angle to the main viewing angle to obtain the second viewing angle curve.

* * * * *